(12) United States Patent
Huang

(10) Patent No.: US 10,969,632 B2
(45) Date of Patent: Apr. 6, 2021

(54) DISPLAY PANEL AND METHOD OF PROCESSING THE SAME

(71) Applicant: HKC CORPORATION LIMITED, Guangdong (CN)

(72) Inventor: Bei Zhou Huang, Guangdong (CN)

(73) Assignee: HKC Corporation Limited, Shenzhen (CN)

( * ) Notice: Subject to any disclaimer, the term of this patent is extended or adjusted under 35 U.S.C. 154(b) by 0 days.

(21) Appl. No.: 16/647,442

(22) PCT Filed: Nov. 7, 2017

(86) PCT No.: PCT/CN2017/109761
§ 371 (c)(1),
(2) Date: Mar. 13, 2020

(87) PCT Pub. No.: WO2019/051964
PCT Pub. Date: Mar. 21, 2019

(65) Prior Publication Data
US 2020/0271969 A1    Aug. 27, 2020

(30) Foreign Application Priority Data

Sep. 15, 2017    (CN) .......................... 201710832064.1

(51) Int. Cl.
*G02F 1/1339* (2006.01)
*G02F 1/1335* (2006.01)
*H05K 1/18* (2006.01)

(52) U.S. Cl.
CPC ...... *G02F 1/1339* (2013.01); *G02F 1/133528* (2013.01); *H05K 1/189* (2013.01); *H05K 2201/10136* (2013.01)

(58) Field of Classification Search
CPC .................................................... G02F 1/1339
See application file for complete search history.

(56) References Cited

U.S. PATENT DOCUMENTS

| 9,612,467 B2 | 4/2017 | Isami | |
| 2016/0306224 A1* | 10/2016 | Ishikawa | G02F 1/133528 |
| 2020/0292864 A1* | 9/2020 | Kim | H05K 1/147 |

FOREIGN PATENT DOCUMENTS

| CN | 103235432 A | 8/2013 |
| CN | 103605222 A | 2/2014 |
| CN | 106483706 A | 3/2017 |
| CN | 106647007 A | 5/2017 |
| CN | 107066131 A | 8/2017 |

* cited by examiner

*Primary Examiner* — Edmond C Lau
(74) *Attorney, Agent, or Firm* — Muncy, Geissler, Olds & Lowe, P.C.

(57) ABSTRACT

The present disclosure provides a display panel and a method of processing a display panel. The display panel comprises a first substrate, a second substrate, a liquid crystal layer, a sealing layer, stopper plates and a flexible circuit unit. The second substrate is disposed opposite to the first substrate. The liquid crystal layer is disposed between the first substrate and the second substrate. The sealing layer disposed on two ends of the liquid crystal layer, and configured to seal the liquid crystal layer. The stopper plates are disposed at positions of end portions of the first substrate. The flexible circuit unit is attached onto the stopper plate and/or the first substrate.

13 Claims, 4 Drawing Sheets

DISPLAY PANEL AND METHOD OF PROCESSING THE SAME

BACKGROUND OF THE INTENTION

Field of Invention

This disclosure relates to a technical field of a display screen, and more particularly to a display panel and method of processing the same.

Related Art

With the development and progress of the technology, the liquid crystal display has the hot features including the thin body, the power-saving property and the low radiation, and has become the mainstream product of the display and obtained the wide application. Most liquid crystal displays in the existing market pertain to a backlight-type liquid crystal display, which includes a liquid crystal panel and a backlight module (back light module). The work principle of the liquid crystal panel is to place liquid crystal molecule in between two parallel glass substrates, and to apply a drive voltage to the two glass substrates to control rotation directions of the liquid crystal molecules to refract the light ray of the backlight module and generate the frame.

Because the thin film transistor-liquid crystal display (TFT-LCD) has the performances including the low power consumption, the excellent frame quality, the higher production yield and the like, it has gradually occupied the leading position of the display field. Similarly, the TFT-LCD includes a liquid crystal panel and a backlight module, the liquid crystal panel includes a second substrate (also referred to as a color filter (CF) substrate), a thin film transistor (TFT) substrate (first substrate) and a mask, wherein a transparent electrode is disposed between opposing inner sides of the substrates. A layer of liquid crystal (LC) molecules is interposed between the two substrates.

A borderless design of TFT-LCD emerges as the times require in order to highlight the integral feeling of the realistic frame.

In the borderless display, the color of the liquid crystal panel and the border are merged into one piece, so that the user cannot see the border when the screen is not lighted up. The implementation principle of such the technology is to merge the originally exposed display border into the body so that the boarder and the display panel are merged into one piece. Such the design becomes more beautiful, and brings the broader viewable area for the user to a certain extent. Therefore, the borderless technology is also growing.

At present, the GOA technology is usually adopted to implement the borderless configuration. That is, gate drives are arranged on the first substrate, thereby implementing the narrow border or even the borderless configuration. However, the GOA technology is relatively complicated, and has the long production cycle, and the manufacturing cost thereof is also not low. This is somewhat less adapted to the era when the electronic products are rapidly updated.

It should be noted that the above-mentioned description of the technical background is merely for the purpose of facilitating the clear and complete descriptions of the technical solutions of this disclosure, and is provided for the understanding of those skilled in the art. The above-mentioned technical solutions are considered to be well known to those skilled in the art merely because these schemes are set forth in the background of this disclosure.

SUMMARY OF THE INVENTION

In view of the above-mentioned defects, the technical problem to be solved by this disclosure is to provide a display panel and a method of processing the same capable of implementing the borderless configuration without the need of the GOA technology.

To achieve the above objective, the present disclosure provides a display panel. The display panel comprises a first substrate, a second substrate, a liquid crystal layer, a sealing layer, stopper plates and a flexible circuit unit. The second substrate is disposed opposite to the first substrate. The liquid crystal layer is disposed between the first substrate and the second substrate. The sealing layer disposed on two ends of the liquid crystal layer, and configured to seal the liquid crystal layer. The stopper plates are disposed at positions of end portions of the first substrate. The flexible circuit unit is attached onto the stopper plate and/or the first substrate. The stopper plates comprises fixing portions and extensions. The fixing portions are adhered and fixed to side surfaces of the end portions of the first substrate. The extension and the fixing portion are integrally formed and extend in a direction toward the second substrate, and a length of the extension is smaller than a thickness of the liquid crystal layer. The number of the stopper plates is equal to two, the two stopper plates are respectively mounted on two of the end portions of the first substrate, and are perpendicularly disposed on the first substrate. The flexible circuit unit has one portion disposed on a surface of the first substrate close to the second substrate, and another portion disposed on inner side surface of the stopper plate. The flexible circuit unit has an L-shaped structure, and the stopper plate has a flat strip shape.

The present disclosure also provides a display panel. The display panel comprises a first substrate, a second substrate, a liquid crystal layer, a sealing layer, stopper plates and a flexible circuit unit. The second substrate is disposed parallel and opposite to the first substrate. The liquid crystal layer is disposed between the first substrate and the second substrate. The sealing layer disposed on two ends of the liquid crystal layer, and configured to seal the liquid crystal layer. The stopper plates are disposed at positions of end portions of the first substrate. The flexible circuit unit provides with a gate drive circuit or a partial circuit of the gate drive circuit. And the flexible circuit unit is attached onto the stopper plate and/or the first substrate.

The present disclosure also provides a method of processing a display panel. The method comprises the following steps. Forming a first substrate. Forming a liquid crystal layer. Forming a second substrate to cooperatively clamp and cover the liquid crystal layer in conjunction with the first substrate. Forming sealing layers for sealing the liquid crystal layers on two ends of the liquid crystal layer. Forming stopper plates on positions of end portions of the first substrate. Disposing a flexible circuit unit electrically connected to the first substrate on the end portions of the first substrate, and attaching the flexible circuit unit to the stopper plate and/or the first substrate.

The borderless display panel basically needs the GOA circuit design for the implementation. Thus, the GOA circuit may need to be re-designed for different panels, and whether the GOA circuit is applicable to the display panel and whether the predetermined quality can be reached cannot be determined until multiple experiments are repeated. This undoubtedly increases the production cycle and cost. In this disclosure, the borderless display panel uses the conventional and quite mature flexible circuit unit (Chip On Flex, COF IC) technology, and the gate drive circuit may be correspondingly constructed in the flexible circuit unit, so that the gate drive circuit needs not to be constructed on the array substrate. On the structure, the flexible circuit unit is appropriately restricted, so that it is disposed between the end portion of the first substrate and the sealing layer, wherein it is possible to restrict it without projecting beyond the end portion of the first substrate through the improvement of the self structure of the flexible circuit unit or through other components, thereby implementing the borderless objective. More particularly, the four-side borderless effect can be achieved in the reasonable configuration. In addition, the stopper plate is disposed on the end portion of the first substrate. With the aid of the stopper plate, the flexible circuit unit can be restricted within the expected space very conveniently and is free from projecting to damage the borderless design.

BRIEF DESCRIPTION OF THE DRAWINGS

The accompanying drawings are included to provide a further understanding of embodiments of the present disclosure, which constitutes a part of the specification, illustrate embodiments of the present disclosure is used, together and explain the principles of the present disclosure with the description. Apparently, the drawings in the following description are only some embodiments of the present disclosure, those of ordinary skill in the art is concerned, without any creative effort, and may also obtain other drawings based on these drawings. In the drawings.

DETAILED DESCRIPTION OF THE INVENTION

Specific structures and function details disclosed herein are only for the illustrative purpose for describing the exemplary embodiment of this disclosure. However, this disclosure can be specifically implemented through many replacements, and should not be explained as being restricted to only the embodiment disclosed herein.

In the borderless display, the color of the liquid crystal panel and the border are merged into one piece, so that the user cannot see the border when the screen is not lighted up. The implementation principle of such the technology is to merge the originally exposed display border into the body so that the boarder and the display panel are merged into one piece. Such the design becomes more beautiful, and brings the broader viewable area for the user to a certain extent. Therefore, the borderless technology is also growing.

The "borderless" display panel basically adopts a first substrate gate drive (Gate Driver on Array, GOA) technology, in which gate drive circuits (gate driver ICs) are directly manufactured on the first substrate. Of course, the GOA technology also has the problems including the long production cycle. This is somewhat less adapted to the era when the electronic products are rapidly updated. Therefore, this disclosure aims at how to implement the borderless display panel using the maturer flexible circuit unit technology.

Figure 1:
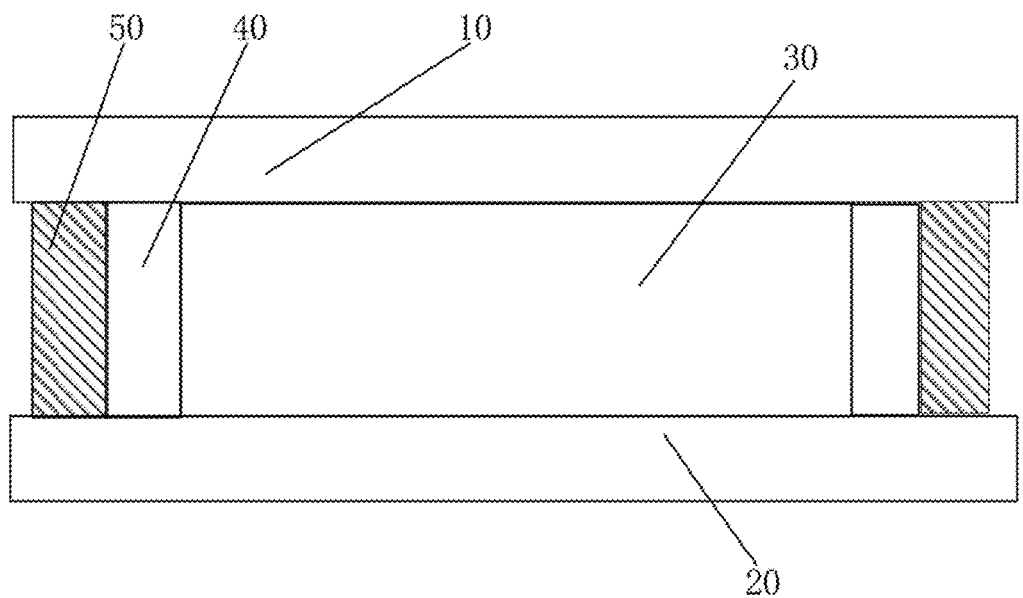
FIG. 1 is a schematic view showing a display panel of this disclosure.
Figure 2:
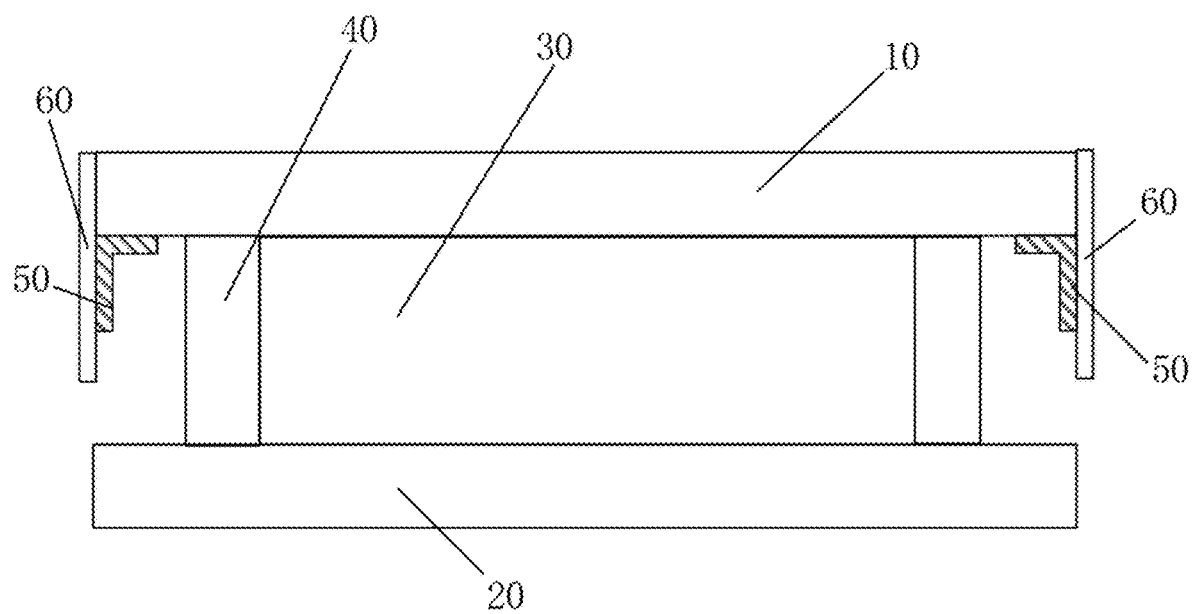
FIG. 2 is a schematic view showing an alternative embodiment of this disclosure.
Figure 3:
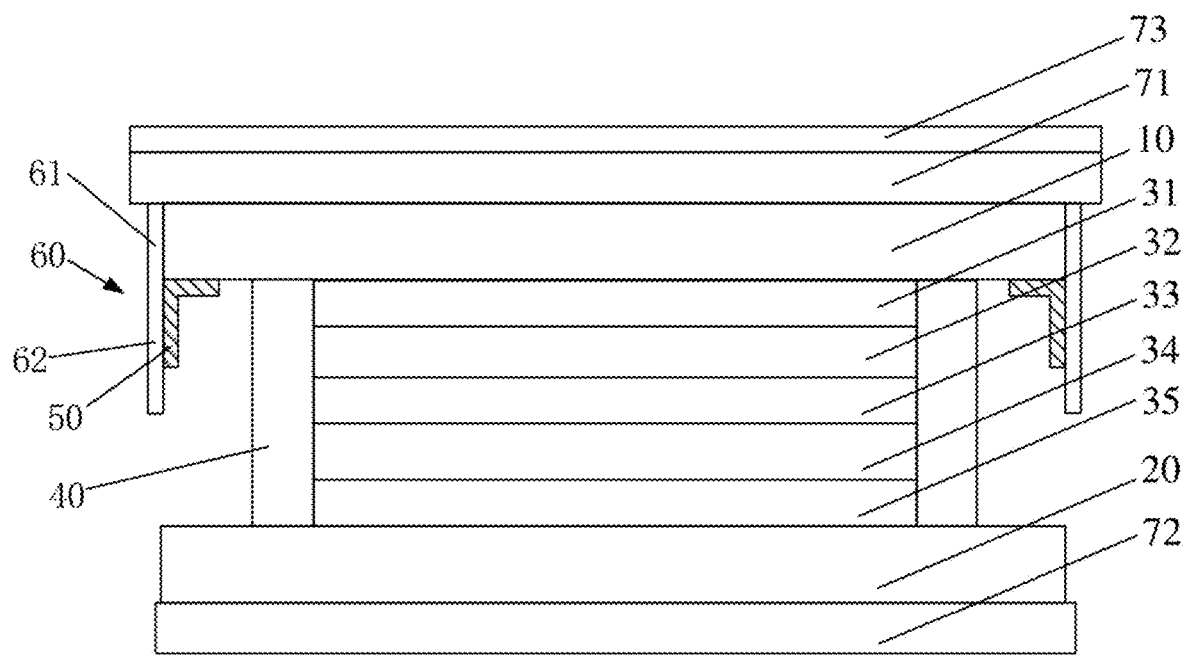
FIG. 3 is a schematic view showing another alternative embodiment of this disclosure.
Figure 4:
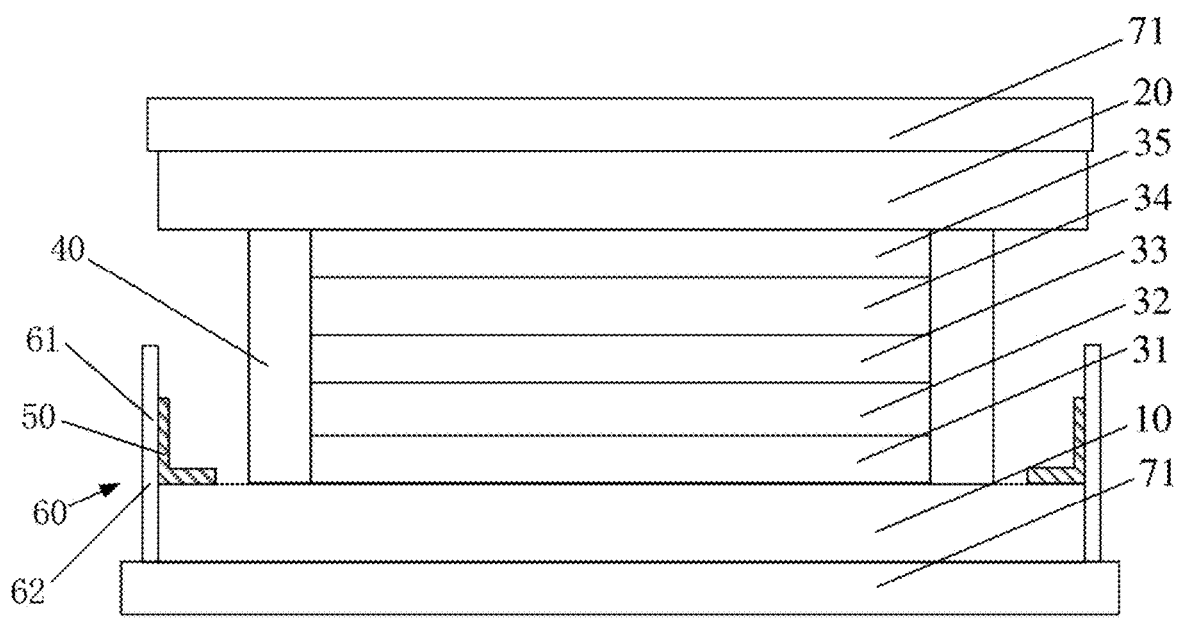
FIG. 4 is a schematic view showing still another alternative embodiment of this disclosure.

Regarding the flexible circuit unit (Chip On Flex or Chip On Film, COF), the flexible membrane film technology is adopted to mount driver ICs on the flexible circuit board, wherein the flexible carrier plate is used as the package chip carrier to bond the chip to the soft substrate circuit. The borderless design of the display panel will be implemented using this technology. The specific details are described in the following:

FIG. 1 is a schematic view showing a display panel of this disclosure. FIG. 2 is a schematic view showing an alternative embodiment of this disclosure. FIG. 3 is a schematic view showing another alternative embodiment of this disclosure. FIG. 4 is a schematic view showing still another alternative embodiment of this disclosure.

Referring to FIGS. 1 to 4, it is obtained that this disclosure provides a display panel includes a first substrate 10, a second substrate 20, a liquid crystal layer 30, a sealing layer 40, stopper plates 60 and a flexible circuit unit 50. The second substrate 20 disposed parallel and opposite to the first substrate 10. The liquid crystal layer 30 disposed between the first substrate 10 and the second substrate 20. The sealing layer 40 disposed on two ends of the liquid crystal layer 30, and configured to seal the liquid crystal layer 30. The stopper plates 60 disposed at positions of end portions of the first substrate 10. The flexible circuit unit 50 attached onto the stopper plate and/or the first substrate. More precisely, the flexible circuit unit 50 provided with a gate drive circuit or a partial circuit of the gate drive circuit. One end electrically connected to the first substrate 10, and the other end attached to the stopper plate 60.

The current borderless display panel basically needs the GOA circuit design for the implementation. Thus, the GOA circuit may need to be re-designed for different panels, and whether the GOA circuit is applicable to the display panel and whether the predetermined quality can be reached cannot be determined until multiple experiments are repeated. This undoubtedly increases the production cycle and cost. In this disclosure, the borderless display panel uses the conventional and quite mature flexible circuit unit (Chip On Flex, COF IC) technology, and the gate drive circuit may be correspondingly constructed in the flexible circuit unit, so that the gate drive circuit needs not to be constructed on the array substrate. On the structure, the flexible circuit unit is appropriately restricted, so that it is disposed between the end portion of the first substrate and the sealing layer, wherein it is possible to restrict it without projecting beyond the end portion of the first substrate through the improvement of the self structure of the flexible circuit unit or through other components, thereby implementing the borderless objective. More particularly, the four-side borderless effect can be achieved in the reasonable configuration. Because of the mature technology of this disclosure, its implementation also does not need many improvements on the display panel, so that the production cycle is short, the production cost can be decreased, and this advantage is very obvious in the rapid replacement of the product, and the pursuit of low-cost era. In addition, the stopper plate is disposed on the end portion of the first substrate. With the aid of the stopper plate, the flexible circuit unit can be restricted within the expected space very conveniently and is free from projecting to damage the borderless design.

The existing display panels mainly include two types. In the first type, the second substrate is disposed in front of the first substrate. In the second type, the first substrate is disposed in front of the second substrate. The two types of substrates have their advantages and drawbacks, and the solution of this disclosure is mainly applied to the latter, but may also be applied to the former.

Optionally in this embodiment, the stopper plates 60 comprises fixing portions 61 and extensions 62. The extension 62 and the fixing portion 61 are integrally formed and extend in a direction toward the second substrate 2. The number of the stopper plates 60 is equal to two, and the two stopper plates 60 are fixed to outer side surfaces of two of the end portions of the first substrate 10 respectively through the fixing portions 61, and are perpendicularly disposed on the first substrate 10. The flexible circuit unit 50 has one portion disposed on a surface of the first substrate 10 close to the second substrate 20, and another portion disposed on an inner side surface of the extension 62. In this embodiment, the stopper plate is perpendicular to the main body of the first substrate and in flat surface contact with the surface of the end portion of the first substrate. Thus, the outer surface of the stopper plate is flat, and this is advantageous to the borderless design, In addition, the flexible circuit unit may be adhered to the first substrate and the inner side surface of the extension, and may also be restricted between the stopper plate and the sealing layer through other methods. Of course, if possible, it may also be directly disposed on the outer surface of the sealing layer as long as the structure allows.

Optionally in this embodiment, the stopper plates 60 comprises fixing portions 61 and extensions 62. The stopper plates 60 are adhered and fixed to side surfaces of the end portions of the first substrate 10 through the fixing portions 61, and are perpendicularly disposed on the first substrate 10. The extension 62 and the fixing portion 61 are integrally formed and extend in a direction toward the second substrate 20. A length of the extension 62 is smaller than a thickness of the liquid crystal layer 30. The number of the stopper plates 60 is equal to two, and the two stopper plates 60 are respectively mounted on two of the end portions of the first substrate 10, and are perpendicularly disposed on the first substrate 10. The flexible circuit unit 50 has one portion disposed on a surface of the first substrate 10 close to the second substrate 20, and another portion disposed on an outer side surface of the sealing layer 40. In this embodiment, the out extending length of the stopper plate may be accepted as long as the stopper plate can fix and stop the flexible circuit unit, and the flexible circuit unit is partially or entirely attached to the outer side surface of the sealing layer an applicable method such as adhering or the lie.

Optionally in this embodiment, the stopper plate 60 is adhered and fixed to the end portions of the first substrate 10, and a length of the stopper plate 60 is shorter than a gap between the first substrate 10 and the second substrate 20. In this embodiment, the out extending length of the stopper plate may be accepted as long as the stopper plate can fix and stop the flexible circuit unit.

Optionally in this embodiment, the stopper plates 60 away from the end portions of the first substrate 10 are disposed on and in flat surface contact with the second substrate 20. In this embodiment, the stopper plate extends to the end portion of the second substrate from the end portion of the first substrate, so that the side end of the overall substrate is replaced by the outer surface of the stopper plate. In addition, such the design can make the two ends of the stopper plate be supported, and prevent the pressure or collision, coming from the side surface of the display panel, from forcing it to deformation or even damaging the inner substrate device, so that the lifetime is lengthened.

Optionally in this embodiment, the display panel further comprises a front polarizer 71 disposed outside the first substrate 10, and a rear polarizer 72 disposed outside the second substrate 20. An outer side surface of the front polarizer 71 is attached with a cover layer 73. In this embodiment, because the first substrate is disposed at front, the cover layer may be disposed on the outer side surface of the front polarizer in order to cover the wiring on the first substrate and the possible light-leakage condition. Thus, it is possible to prevent the above-mentioned condition from happening. Since the cover layer is not the main application point of this disclosure, detailed descriptions thereof will be omitted.

Optionally in this embodiment, the liquid crystal layer is successively provided with a thin film transistor array 31, a first polarizing layer 32, a liquid crystal layer 33, a second polarizing layer 34 and a color filter layer 35 from the side of the first substrate 10 to the side of the second substrate 20. The outside of the second substrate 20 is provided with a backlight module (not shown in the drawing).

Optionally in this embodiment, the flexible circuit unit has an L-shaped structure, and the stopper plate has a flat strip shape. In this embodiment, the L-shaped structure facilitates the provision of the bent portion on the flexible circuit unit, wherein the bent portion is attached onto the stopper plate and the first substrate, and the provision of the platform strip stopper plate is advantageous to the implementation of the narrow border and borderless products.

Figure 5:
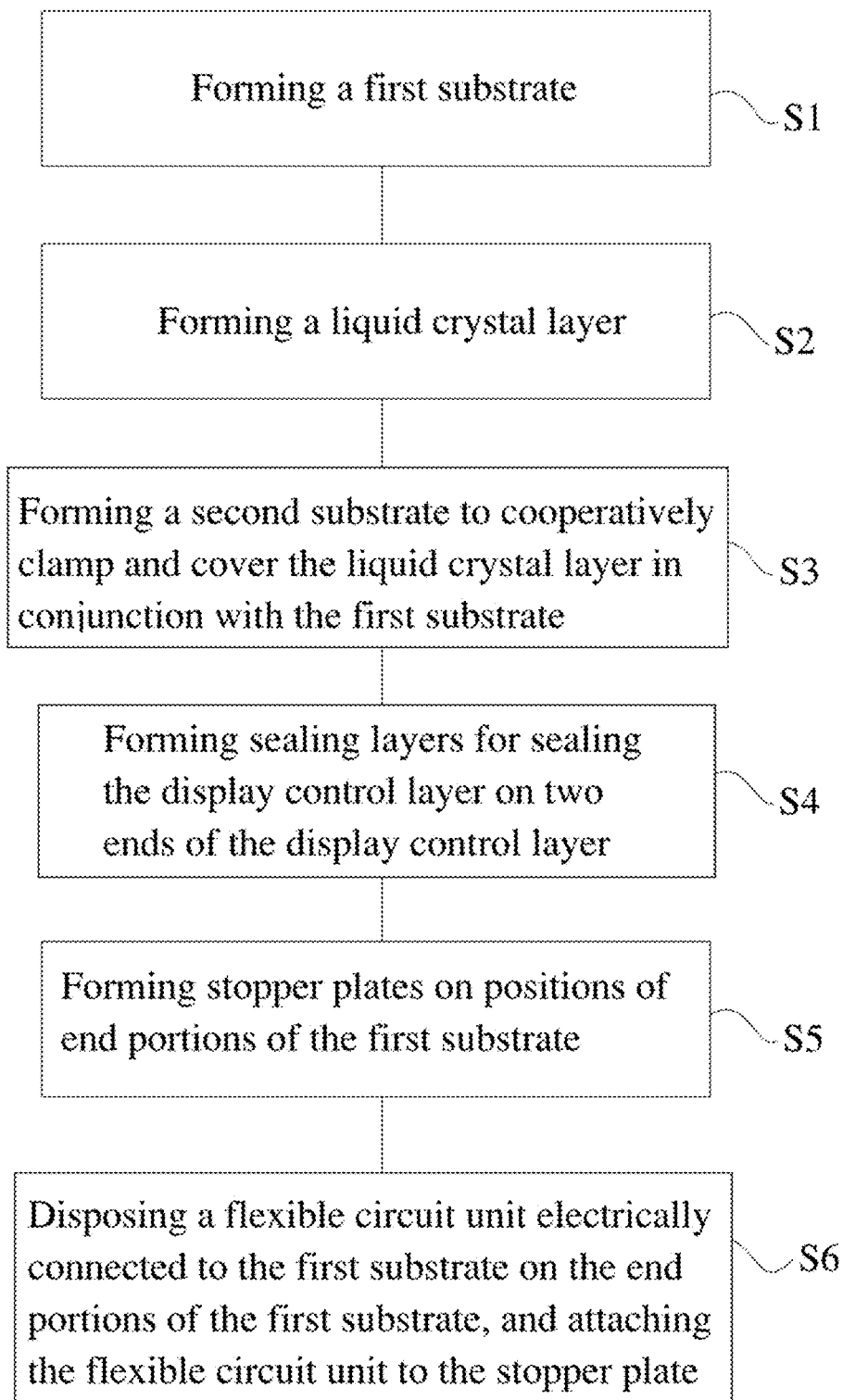
FIG. 5 is a flow chart showing manufacturing processes of a display panel of this disclosure.

FIG. 5 is a flow chart showing manufacturing processes of a display panel of this disclosure. Referring to FIG. 5 in combination with FIGS. 1 to 4, it is obtained that this disclosure discloses a method of processing a display panel. The method comprises the following steps:

Step S1: forming a first substrate;

Step S2: forming a liquid crystal layer;

Step S3: forming a second substrate to cooperatively clamp and cover the liquid crystal layer in conjunction with the first substrate;

Step S4: forming sealing layers for sealing the liquid crystal layers on two ends of the liquid crystal layer;

Step S5: forming stopper plates on positions of end portions of the first substrate; and Step S6: disposing a flexible circuit unit electrically connected to the first substrate on the end portions of the first substrate, and attaching the flexible circuit unit to the stopper plate and/or the first substrate.

Optionally in this embodiment, the flexible circuit unit provides with a gate drive circuit or a partial circuit of the gate drive circuit. The stopper plates comprises fixing portions and extensions. The extension and the fixing portion are integrally formed and extend in a direction toward the second substrate. The number of the stopper plates is equal to two, and the two stopper plates are fixed to outer side surfaces of two of the end portions of the first substrate respectively through the fixing portions, and are perpendicularly disposed on the first substrate. The flexible circuit unit has one portion disposed on a surface of the first substrate close to the second substrate, and another portion disposed on an inner side surface of the extension. The stopper plate is adhered and fixed to the end portions of the first substrate, and a length of the stopper plate is shorter than a gap between the first substrate and the second substrate. The display panel further comprises a front polarizer disposed outside the first substrate, and a rear polarizer disposed outside the second substrate. An outer side surface of the front polarizer is attached with a cover layer. The liquid crystal layer is successively provided with a thin film transistor array, a first polarizing layer, a liquid crystal layer, a second polarizing layer and a color filter layer from the side of the first substrate to the side of the second substrate. The outside of the second substrate is provided with a backlight module.

Figure 6:
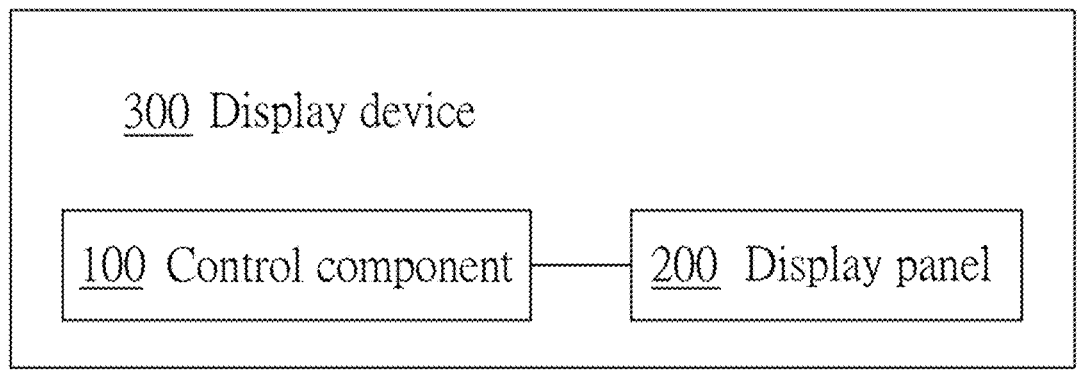
FIG. 6 is a schematic view showing a display device of this disclosure.

FIG. 6 is a schematic view showing a display device of this disclosure. Referring to FIG. 6 in combination with FIGS. 1 to 5, it is obtained that this disclosure discloses a display device 300 including a control component 200, and any one of the display panels 100 of this disclosure.

In the above-mentioned embodiment, the display panels include a liquid crystal panel, an organic light-emitting diode (OLED) panel, a quantum dot light emitting diode (QLED) panel, a plasma panel, a flat panel, a curved panel and the like. Taking the liquid crystal panel as an example, the liquid crystal layer is filled with the liquid crystal molecules, and the electric field controls the liquid crystal molecules to deflect and achieve the display control objective.

Detailed descriptions are made by taking the above-mentioned display panel as an example. It is to be described that the descriptions for the structure of the display panel is also applicable to the display device of the embodiment of this disclosure. When the display device of the embodiment of this disclosure is the liquid crystal display, the liquid crystal display includes a backlight module functioning as a light source for supplying the sufficient brightness and the uniformly distributed light source. The backlight module of this embodiment may be reflective and may also has the backlight type. It is to be described that the backlight module of this embodiment is not restricted thereto.

Although the disclosure has been described with reference to specific embodiments, this description is not meant to be construed in a limiting sense. Various modifications of the disclosed embodiments, as well as alternative embodiments, will be apparent to persons skilled in the art. It is, therefore, contemplated that the appended claims will cover all modifications that fall within the true scope of the disclosure.

What is claimed is:

1. A display panel, comprising:
a first substrate;
a second substrate disposed opposite to the first substrate;
a liquid crystal layer disposed between the first substrate and the second substrate;
a sealing layer disposed on two ends of the liquid crystal layer, and configured to seal the liquid crystal layer;
stopper plates disposed at positions of end portions of the first substrate; and
a flexible circuit unit attached onto the stopper plate or the first substrate;
wherein the stopper plates comprises fixing portions and extensions; and the fixing portions are adhered and fixed to side surfaces of the end portions of the first substrate; and the extension and the fixing portion are integrally formed and extend in a direction toward the second substrate, and a length of the extension is smaller than a thickness of the liquid crystal layer;
wherein the number of the stopper plates is equal to two, the two stopper plates are respectively mounted on two of the end portions of the first substrate, and are perpendicularly disposed on the first substrate; and the flexible circuit unit has one portion disposed on a surface of the first substrate close to the second substrate, and another portion disposed on inner side surface of the stopper plate;
wherein the flexible circuit unit has an L-shaped structure, and the stopper plate has a flat strip shape.

2. A display panel, comprising:
a first substrate;
a second substrate disposed opposite to the first substrate;
a liquid crystal layer disposed between the first substrate and the second substrate;
a sealing layer disposed on two ends of the liquid crystal layer, and configured to seal the liquid crystal layer;
stopper plates disposed at positions of end portions of the first substrate; and
a flexible circuit unit attached onto the stopper plate or the first substrate,
wherein the stopper plates comprises fixing portions and extensions, the extension and the fixing portion are integrally formed and extend in a direction toward the second substrate, the number of the stopper plates is equal to two, and the two stopper plates are fixed to outer side surfaces of two of the end portions of the first substrate respectively through the fixing portions disposed on a surface of the first substrate close to the second substrate and another portion disposed on an inner side surface of the extension.

3. The display panel according to claim 2, wherein the flexible circuit unit is attached onto the stopper plate.

4. The display panel according to claim 2, wherein the flexible circuit unit is attached onto the first substrate.

5. The display panel according to claim 2, wherein the flexible circuit unit is attached onto the stopper plate and the first substrate.

6. The display panel according to claim 2, wherein the stopper plate is adhered and fixed to the end portions of the first substrate, and a length of the stopper plate is shorter than a gap between the first substrate and the second substrate.

7. The display panel according to claim 2, wherein the stopper plates away from the end portions of the first substrate are disposed on and in flat surface contact with the second substrate.

8. The display panel according to claim 2, further comprising a front polarizer disposed outside the first substrate, and a rear polarizer disposed outside the second substrate; wherein an outer side surface of the front polarizer is attached with a cover layer.

9. The display panel according to claim 2, wherein the flexible circuit unit has an L-shaped structure, and the stopper plate has a flat strip shape.

10. A method of processing a display panel, the method comprising steps of:
forming a first substrate;
forming a liquid crystal layer;
forming a second substrate to cooperatively clamp and cover the liquid crystal layer in conjunction with the first substrate;
forming sealing layers for sealing the liquid crystal layers on two ends of the liquid crystal layer;
forming stopper plates on positions of end portions of the first substrate; and
disposing a flexible circuit unit electrically connected to the first substrate on the end portions of the first substrate, and attaching the flexible circuit unit to the stopper plate or the first substrate,
wherein the stopper plates comprises fixing portions and extensions, the extension and the fixing portion are integrally formed and extend in a direction toward the second substrate, the member of the stopper plates is equal to two, and the two stopper plates are fixed to outer side surfaces of two of the end portions of the first substrate respectively through the fixing portions and are perpendicularly disposed on the first substrate, the flexible circuit unit has one portion disposed on a surface of the first substrate close to the second substrate and another portion disposed on an inner side surface of the extension.

11. The method of processing a display panel according to claim 10, wherein the flexible circuit unit has an L-shaped structure, and the stopper plate has a flat strip shape.

12. The method of processing a display panel according to claim 10, wherein the stopper plate is adhered and fixed to the end portions of the first substrate, and a length of the stopper plate is shorter than a gap between the first substrate and the second substrate.

13. The method of processing a display panel according to claim 10, further comprising a front polarizer disposed outside the first substrate, and a rear polarizer disposed outside the second substrate; wherein an outer side surface of the front polarizer is attached with a cover layer.

* * * * *